(12) United States Patent
Kobayashi et al.

(10) Patent No.: US 12,550,248 B2
(45) Date of Patent: Feb. 10, 2026

(54) PRINTED CIRCUIT BOARD AND PRINTING APPARATUS

(71) Applicant: CANON KABUSHIKI KAISHA, Tokyo (JP)

(72) Inventors: Yo Kobayashi, Nagareyama (JP); Koji Hirai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 18/362,742

(22) Filed: Jul. 31, 2023

(65) Prior Publication Data

US 2024/0023226 A1 Jan. 18, 2024

Related U.S. Application Data

(63) Continuation of application No. 17/729,933, filed on Apr. 26, 2022, now Pat. No. 11,758,643, which is a continuation of application No. 16/983,804, filed on Aug. 3, 2020, now Pat. No. 11,343,903.

(30) Foreign Application Priority Data

Aug. 9, 2019 (JP) .................. 2019-147445

(51) Int. Cl.
*H05K 1/02* (2006.01)
(52) U.S. Cl.
CPC ......... *H05K 1/0219* (2013.01); *H05K 1/0215* (2013.01); *H05K 2201/0707* (2013.01); *H05K 2201/10409* (2013.01)

(58) Field of Classification Search
CPC .................................................... H05K 1/0219
USPC .......................................................... 361/753
See application file for complete search history.

(56) References Cited

U.S. PATENT DOCUMENTS

| 6,019,614 A | * | 2/2000 | Baur | ................... | H05K 9/0039 |
| | | | | | 439/92 |
| 10,571,831 B1 | * | 2/2020 | Takahashi | ............ | G03G 15/161 |
| 2004/0090748 A1 | | 5/2004 | Kishimoto | | |
| 2019/0223287 A1 | * | 7/2019 | Nishida | ................ | H05K 5/0069 |
| 2020/0099174 A1 | * | 3/2020 | Andre | ................ | H01R 13/6587 |

FOREIGN PATENT DOCUMENTS

| CN | 101647326 A | 2/2010 |
| JP | 2009248635 A | 10/2009 |

* cited by examiner

*Primary Examiner* — Stanley Tso
(74) *Attorney, Agent, or Firm* — Canon U.S.A., Inc. IP Division

(57) ABSTRACT

A printed circuit board includes a front layer including frame ground regions on which connectors to be connected with external apparatuses or communication cables are mounted and which are connected with a ground, a signal ground region which is separated from the frame ground regions at the front layer, on which electronic devices configured to receive signals from the connectors are mounted, and which is connected with a ground, and a static electricity removal ground region separated from the frame ground regions and the signal ground region at the front layer, situated outside the frame ground regions, and connected with a ground.

17 Claims, 7 Drawing Sheets

ENLARGED VIEW OF PORTION C IN FIG. 3

ENLARGED VIEW OF PORTION B IN FIG. 3

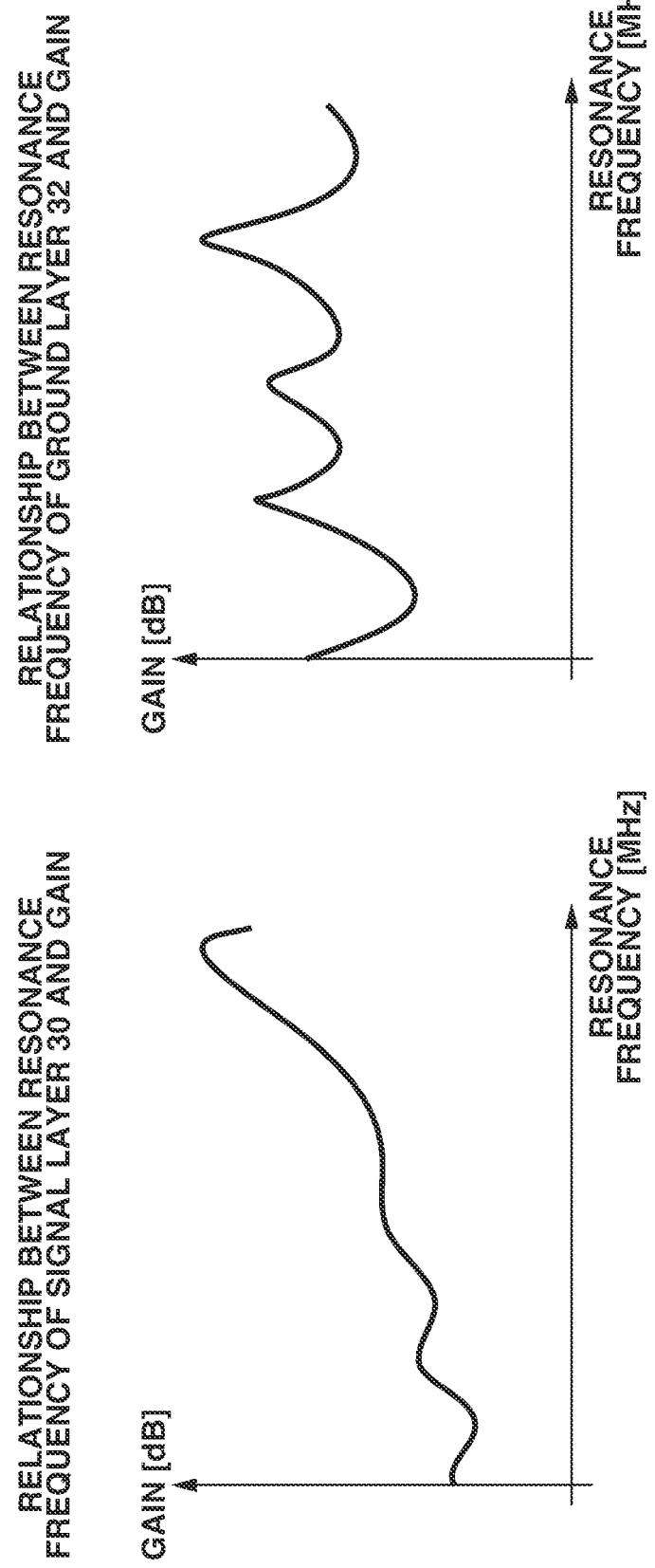

PRINTED CIRCUIT BOARD AND PRINTING APPARATUS

CROSS-REFERENCE TO RELATED APPLICATIONS

The present application is a continuation of U.S. patent application Ser. No. 17/729,933, filed on Apr. 26, 2022, which is a continuation of U.S. patent application Ser. No. 16/983,804, filed on Aug. 3, 2020 and issued as U.S. Pat. No. 11,343,903 on May 24, 2022, which claims priority from Japanese Patent Application No. 2019-147445 filed Aug. 9, 2019, which are both hereby incorporated by reference herein in their entireties.

BACKGROUND OF THE INVENTION

Field of the Invention

The present disclosure relates to printed circuit boards and printing apparatuses.

Description of the Related Art

An electronic device includes a built-in printed circuit board (PCB) fixed to a housing. Passive components, such as a resistor and capacitor, and active components, such as an integrated circuit (IC) are mounted on the printed circuit board.

In recent years, the sizes of printed circuit boards have been reduced due to an effect of size reduction of electronic devices. Further, downsizing and high integration of ICs to be mounted on printed circuit boards have been developed in order to reduce power consumption and improve performance.

As a result of board size reduction, the area of a ground to be a reference potential of a printed circuit board is decreased, and it becomes difficult for noise such as static electricity to escape and difficult to stabilize a voltage level. Furthermore, as a result of downsizing and high integration of ICs, antistatic properties are decreased, and erroneous operations and damage originating from disturbance noise such as static electricity often occur.

Japanese Patent Application Laid-Open No. 2018-117131 discusses a control board 5 in which a frame ground region 53 and a signal ground region 52 are situated with an insulation distance ΔL2 therebetween.

In Japanese Patent Application Laid-Open No. 2018-117131, since the frame ground region 53 and the signal ground region 52 are separated by the insulation distance ΔL2, signal transmission from the frame ground region 53 to the signal ground region 52 is prevented. However, it is difficult to prevent static electricity from entering the frame ground region 53. For example, in a case where a connector to be connected with a cable or an external apparatus is mounted on the frame ground region 53, static electricity charged on the hand of a person holding the cable or the external apparatus, the cable, or the external apparatus enters the frame ground region 53. In Japanese Patent Application Laid-Open No. 2018-117131, signal transmission from the frame ground region 53 to the signal ground region 52 is prevented, but it is difficult to prevent transmission of all the static electricity. Thus, if an entrance of static electricity to the frame ground region 53 is prevented, an entrance of static electricity to the signal ground region 52 is also prevented.

SUMMARY

The present disclosure is to solve the above-described issue and is directed to a printed circuit board configured to prevent static electricity from entering a ground region on which a connector is mounted.

In order to achieve this, a printed circuit board according to the present disclosure may comprise a front layer including: a first ground region on which a connector to be connected with an external apparatus or communication cable is mounted and which is connected with a ground; a second ground region which is separated from the first ground region at the front layer, on which an electronic device configured to receive a signal from the connector is mounted, and which is connected with a ground; and a third ground region separated from the first ground region and the second ground region at the front layer, situated outside the first ground region, and connected with a ground.

Further features of the present disclosure will become apparent from the following description of exemplary embodiments with reference to the attached drawings.

BRIEF DESCRIPTION OF THE DRAWINGS

FIG. 7 illustrates a relationship between a resonance frequency of a signal layer and a gain, and a relationship between a resonance frequency of a ground layer and a gain.

DESCRIPTION OF THE EMBODIMENTS

Figure 1:
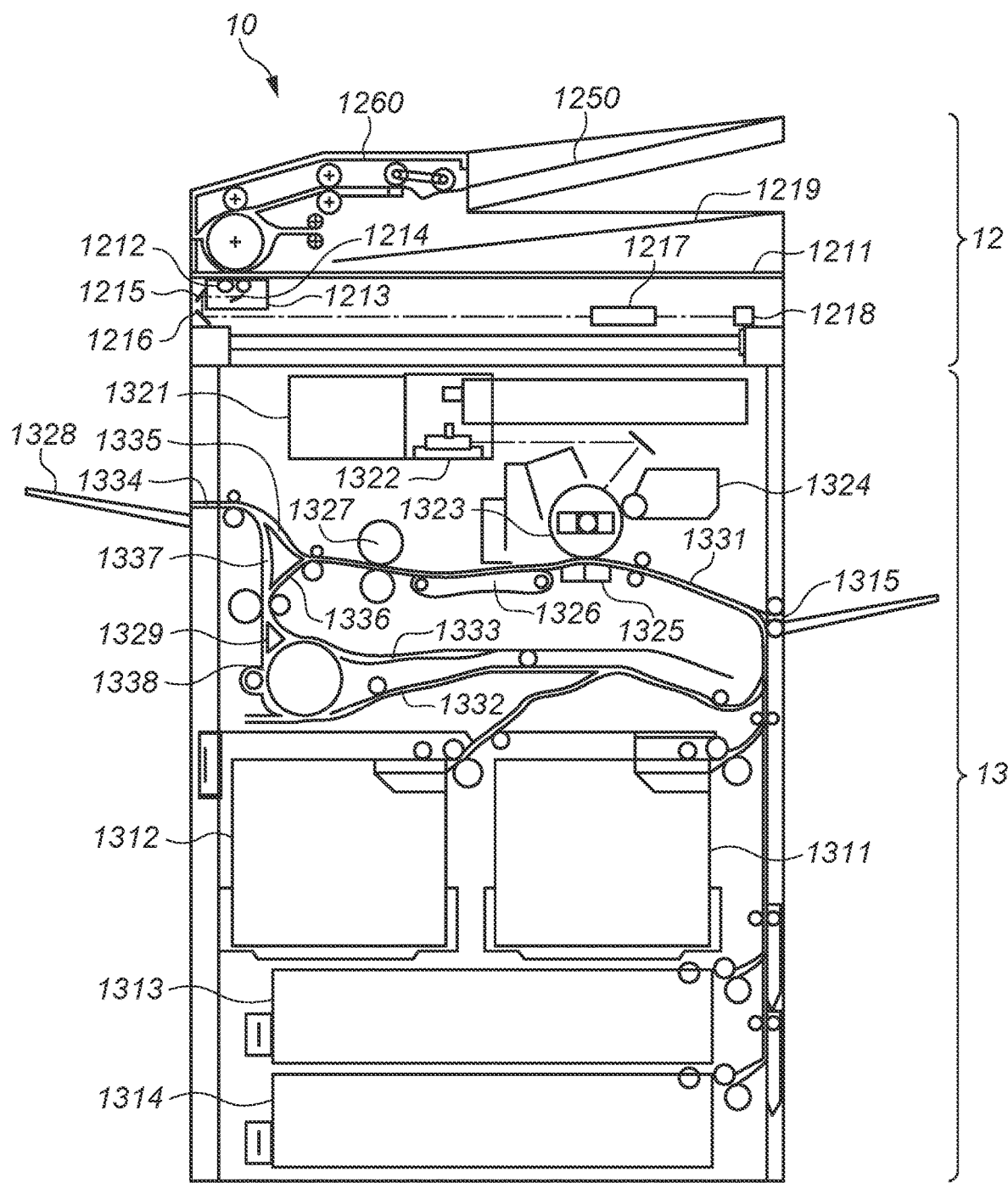
FIG. 1 illustrates a configuration of an image forming apparatus.

It should be noted that the following embodiments are merely illustrative and not intended to limit the scope of the claimed invention and that not every combination disclosed in the embodiments is always essential to a technical solution of the present disclosure. The present invention is also not limited to the configurations shown in the drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

First Embodiment

Embodiments of the present disclosure will be described below with reference to the drawings.

<Overall Configuration of an Image Forming Apparatus>

FIG. 1 illustrates a configuration of an image forming apparatus according to a first embodiment of the present disclosure. As illustrated in FIG. 1, an image forming apparatus 10 includes a scanner unit 12 and a printer unit 13. The scanner unit 12 is an image input device, and the printer unit 13 is an image output device.

The scanner unit 12 is a device configured to read an image formed on a document and acquire image data.

Reflection light of light with which an image formed on a document is irradiated is input to a charge-coupled device (CCD) image sensor so that information about the image is converted into an electric signal. The electric signal is converted into luminance signals R, G, and B, and the luminance signals R, G, and B are output to a controller 11, which will be described below with reference to FIG. 2.

Documents set on a tray 1250 of the scanner unit 12 are fed one by one by a document feeder 1260 to a reading position of an optical unit 1213 on a platen glass 1211. Then, each document read by the optical unit 1213 is discharged to a sheet discharge tray 1219. Light emitted from a lamp 1212 of the optical unit 1213 and reflected by a document is input to a CCD image sensor 1218 via mirrors 1214, 1215, and 1216 and a lens 1217. Regarding the document reading method and alternatively to an automatic feeding method by the document feeder 1260, a method of scanning a document on the platen glass 1211 with a carriage on which the optical unit 1213 is mounted can be employed. While the image forming apparatus 10 is configured to perform monochrome printing in the first embodiment, it can also be configured to perform color printing.

The printer unit 13 is a device configured to form an image on a sheet using input image data. While an image forming method of the printer unit 13 according to the present embodiment is an electrophotographic method using a photosensitive drum or photosensitive belt, the present disclosure is not limited to that method. For example, the printer unit 13 may employ an inkjet method in which an ink is discharged from a micro-nozzle array to print an image on a sheet.

The image forming apparatus 10 further includes a plurality of sheet cassettes 1311, 1312, 1313, and 1314 and a manual sheet feeding tray 1315. Sheets on which an image is to be formed by the printer unit 13 are stored in the plurality of sheet cassettes 1311, 1312, 1313, and 1314. A laser driver 1321 of the printer unit 13 drives a laser light emission unit 1322. The laser driver 1321 emits laser light corresponding to image data output from the controller 11 by the laser light emission unit 1322. The laser light is emitted to a photosensitive drum 1323, and a latent image corresponding to the laser light is formed on the photosensitive drum 1323. A development device 1324 applies a development agent to the latent image portion of the photosensitive drum 1323. A transfer unit 1325 transfers the development agent applied to the photosensitive drum 1323 to a recording sheet conveyed through a sheet conveyance path 1331. The recording sheet with the development agent thereon is conveyed to a fixing device 1327 by a sheet conveyance belt 1326. The fixing device 1327 fixes the development agent to the recording sheet with heat and pressure. The recording sheet conveyed through the fixing device 1327 is conveyed through sheet conveyance paths 1335 and 1334 and is then discharged to a sheet discharge tray 1328. In a case where a printed surface is to be reversed and the reversed recording sheet is to be discharged to the sheet discharge tray 1328, the recording sheet is guided to sheet conveyance paths 1336 and 1338 and thereafter conveyed through a sheet conveyance path 1337 and the sheet conveyance path 1334.

Further, in a case of two-sided printing, a recording sheet is guided from the fixing device 1327 through the sheet conveyance path 1336 and then guided to a sheet conveyance path 1333 by a flapper 1329. Thereafter, the recording sheet is conveyed in the reverse direction and guided to the sheet conveyance path 1338 and a re-feed conveyance path 1332 by the flapper 1329. The recording sheet guided to the re-feed conveyance path 1332 is conveyed through the sheet conveyance path 1331 and fed to the transfer unit 1325.

<Description of a Controller 11 of an Image Forming Apparatus 10>

Figure 2:
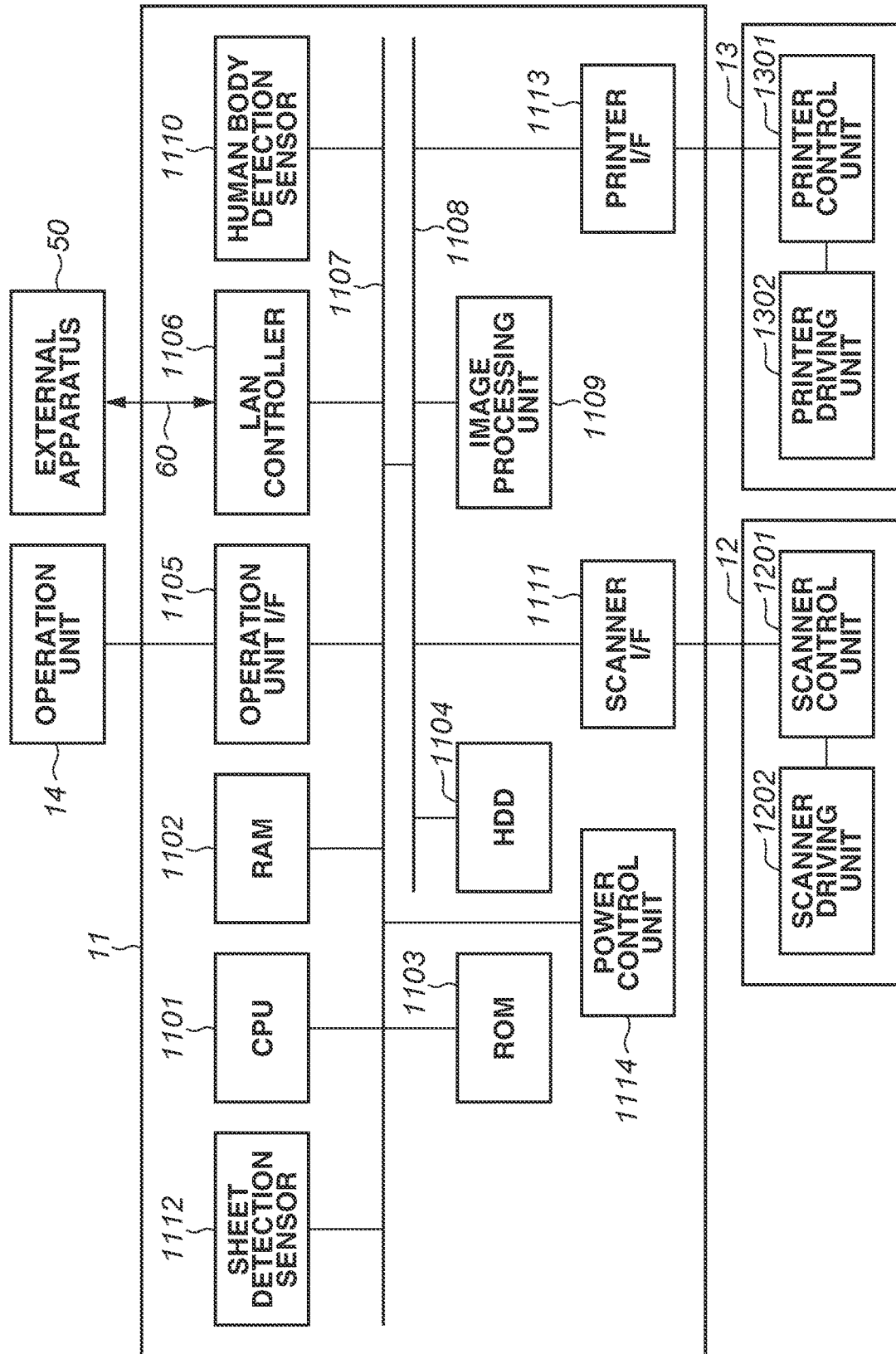
FIG. 2 is a block diagram illustrating a controller.

FIG. 2 is a block diagram illustrating a controller that controls the entire image forming apparatus. The controller 11 configured to control entire operations of the image forming apparatus 10 will be described in detail below with reference to FIG. 2.

As illustrated in FIG. 2, the controller 11 is electrically connected with the scanner unit 12, the printer unit 13, and an operation unit 14. The devices of the controller 11 according to the present embodiment are mounted on a single printed circuit board. Alternatively, the devices of the controller 11 can separately be mounted on two or more printed circuit boards. For example, the controller 11 can include a printed circuit board on which an operation unit interface (operation unit I/F) 1105 and a human body detection sensor 1110 are mounted and another printed circuit board on which a central processing unit (CPU) 1101 is mounted. The controller 11 includes the CPU 1101, a random access memory (RAM) 1102, a read-only memory (ROM) 1103, the operation unit I/F 1105, a local area network (LAN) controller 1106, the human body detection sensor 1110, a sheet detection sensor 1112, and a power control unit 1114. The CPU 1101, the RAM 1102, the ROM 1103, the operation unit I/F 1105, the LAN controller 1106, the human body detection sensor 1110, the sheet detection sensor 1112, and the power control unit 1114 are connected with a system bus 1107. The controller 11 further includes a hard disk drive (HDD) 1104, an image processing unit 1109, a scanner interface (scanner I/F) 1111, and a printer interface (printer I/F) 1113. The HDD 1104, the image processing unit 1109, the scanner I/F 1111, and the printer I/F 1113 are connected with an image bus 1108.

The CPU 1101 comprehensively controls access to/from each connected device based on a control program stored in the ROM 1103. The CPU 1101 also comprehensively controls various types of processing performed by the controller 11.

The RAM 1102 is a system work memory for the CPU 1101 to operate. The RAM 1102 is also a memory for temporarily storing image data. The RAM 1102 includes a static RAM (SRAM) and a dynamic RAM (DRAM). Data stored on the SRAM is retained even if the power is turned off, whereas data stored on the DRAM is erased when the power is turned off. The ROM 1103 stores an apparatus boot program. The HDD 1104 is a hard disk drive and stores a program for controlling the image forming apparatus and image data.

The operation unit I/F 1105 is an interface unit for connecting the system bus 1107 and the operation unit 14. The operation unit I/F 1105 receives image data to be displayed on the operation unit 14 from the system bus 1107, outputs the received image data to the operation unit 14, and outputs information input from the operation unit 14 to the system bus 1107.

The LAN controller 1106 controls input and output of information between the image forming apparatus 10 and an external apparatus 50 connected with a network 60.

The human body detection sensor 1110 is an infrared sensor array in which infrared sensors configured to receive infrared rays are arranged in matrix. The human body detection sensor 1110 receives infrared rays emitted from a person to thereby detect the person having come near the image forming apparatus 10. While an example in which the human body detection sensor 1110 detects a person is described in the present embodiment, any objects that emit infrared rays can be detected by the human body detection sensor 1110. The human body detection sensor is not limited to the infrared sensor described above. Any devices other than an infrared sensor that are sensors (an optical sensor configured to detect light, a distortion sensor configured to be distorted by physical force, a magnetic sensor configured to detect magnetism, and a temperature sensor configured to detect temperature) configured to detect an object having come near the image forming apparatus 10 can be employed.

The sheet detection sensor 1112 detects placement of a sheet on the manual sheet feeding tray 1315.

The power control unit 1114 controls power supply to the components of the image forming apparatus 10. Details of the power control unit 1114 will be described below.

The image bus 1108 is a transmission path for exchanging image data and is a peripheral component interconnect (PCI) bus, an Institute of Electrical and Electronics Engineers (IEEE) 1394 bus, or the like.

The image processing unit 1109 performs image processing. The image processing unit 1109 reads image data stored in the RAM 1102 and performs image processing such as enlargement or reduction, based on e.g., Joint Photographic Experts Group (JPEG) or Joint Bi-level Image Experts Group (JBIG), and color adjustment, on the read image data.

The scanner unit 12 includes a scanner control unit 1201 and a scanner driving unit 1202. The scanner driving unit 1202 is a device that includes a motor for conveying a document set on the tray 1250 to a reading position of the scanner unit 12 and physically drives. The scanner control unit 1201 controls operations of the scanner driving unit 1202. The scanner control unit 1201 receives setting information set by a user at the time of performing scanner processing via communication with the CPU 1101 and controls the operations of the scanner driving unit 1202 based on the setting information.

The printer unit 13 includes a printer control unit 1301 and a printer driving unit 1302. The printer driving unit 1302 is a device that includes a motor for rotating the photosensitive drum 1323, a motor for rotating the fixing device 1327, and a sheet conveyance motor and physically drives. The printer control unit 1301 controls operations of the printer driving unit 1302. The printer control unit 1301 receives setting information set by the user at the time of performing printing processing via communication with the CPU 1101 and controls the operations of the printer driving unit 1302 based on the setting information.

<Description of a Printed Circuit Board>

Figure 3:
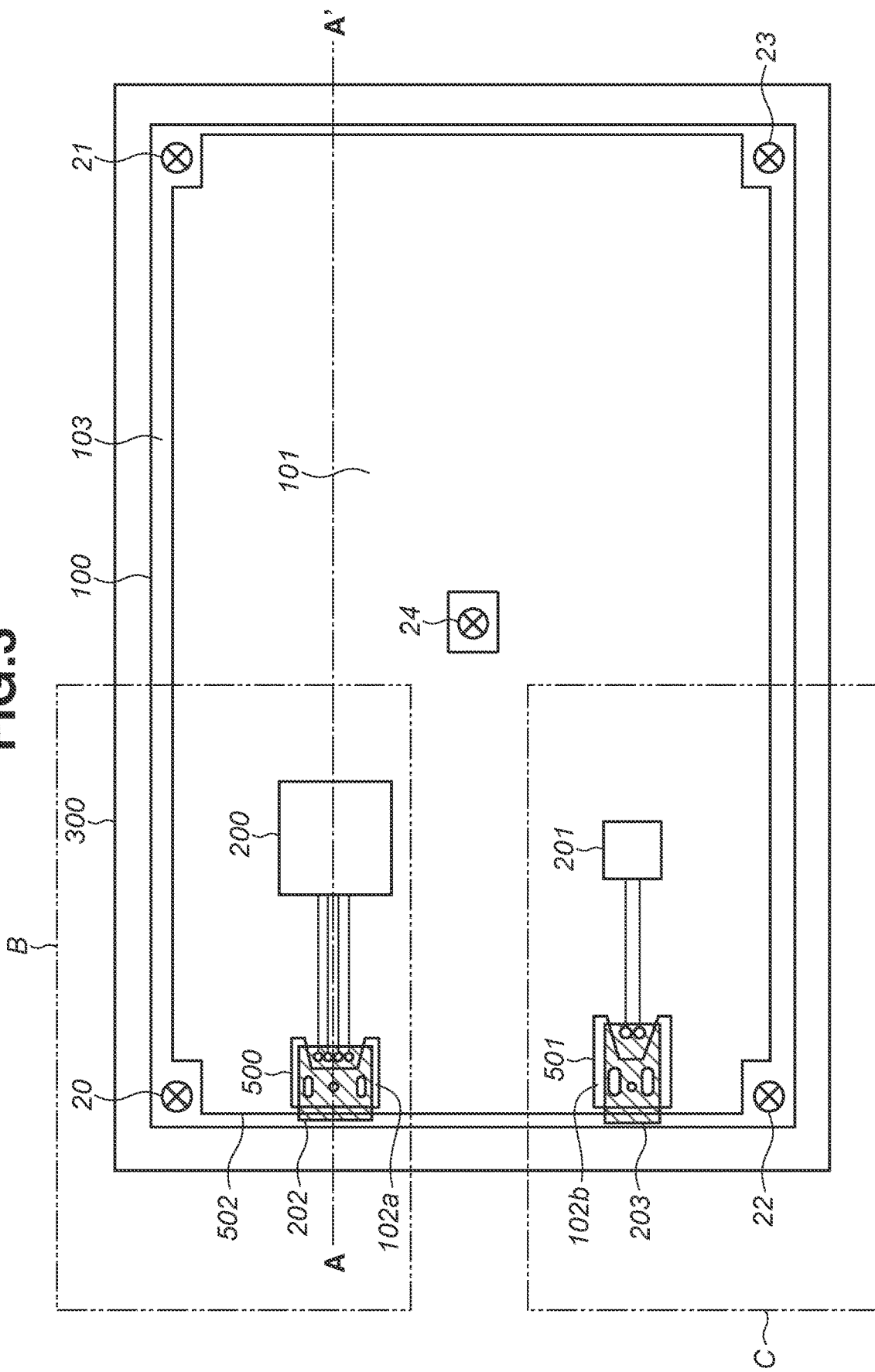
FIG. 3 illustrates a printed circuit board in detail.
Figure 4B:
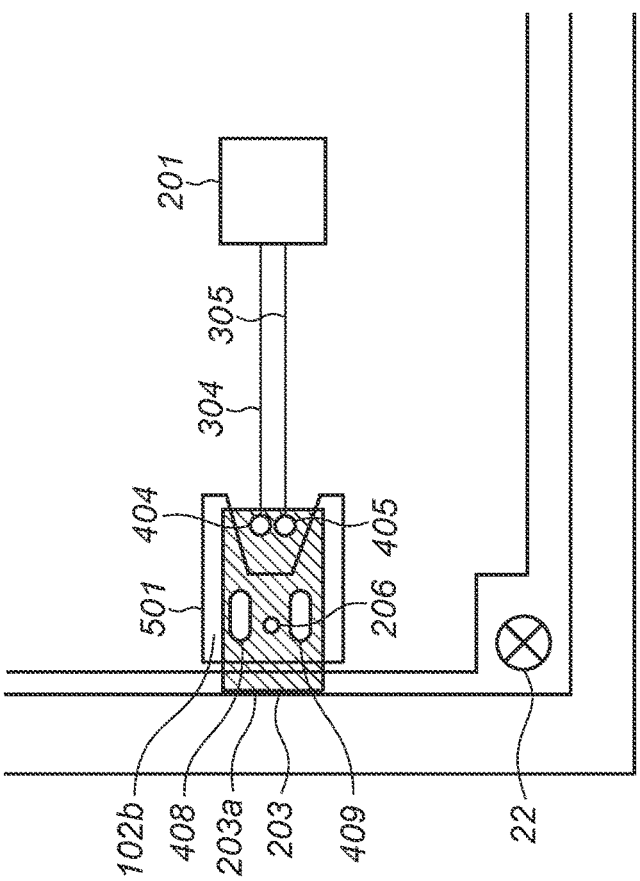
FIG. 4B is an enlarged view of another portion of the printed circuit board.
Figure 4A:
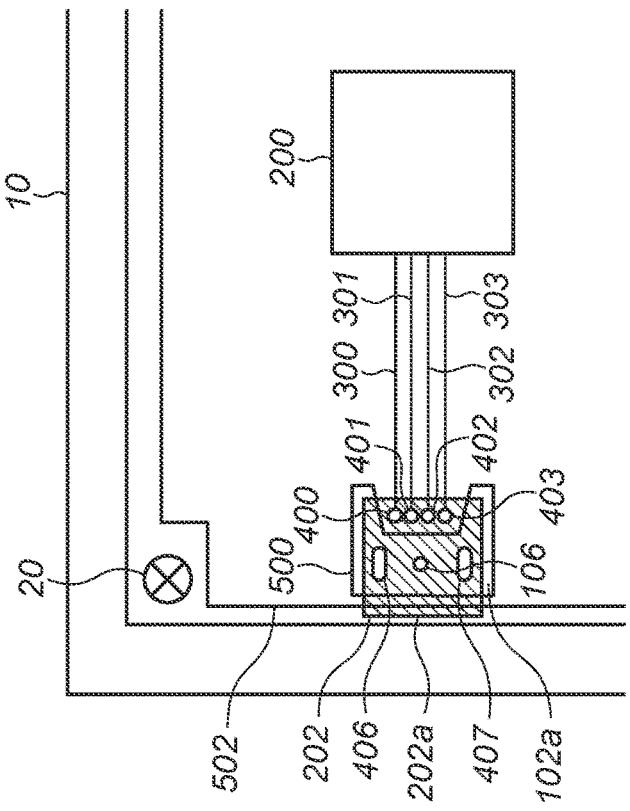
FIG. 4A is an enlarged view of a portion of a printed circuit board.

FIGS. 3, 4A, and 4B illustrate a printed circuit board in detail. A printed circuit board 100 is fixed to a metallic housing 600 with metallic screws 20 to 24. Integrated circuits (ICs) 200 and 201 are mounted on the printed circuit board 100. The IC 200 is the CPU 1101, and the IC 201 is the LAN controller 1106. Further, connectors 202 and 203 are mounted on the printed circuit board 100. An external apparatus and a cable (e.g., universal serial bus (USB) device, USB cable) are connected to the connector 202, and another external apparatus and cable (e.g., Ethernet router, Ethernet cable) are connected to the connector 203. Signals 300, 301, 302, and 303 are transmitted between the IC 200 and the connector 202. Signals 304 and 305 are transmitted between the IC 201 and the connector 203. The IC 200 communicates with the external apparatus via the connector 202. The IC 201 communicates with an external apparatus via the connector 203. Each of the signals 300 to 305 can be a signal configured to transmit a clock signal, a data signal, supply power, or a signal connected to the ground. In the present embodiment, the connector 202 is a four-pin (pins 400, 401, 402, and 403) connector, and the connector 203 is a two-pin (pins 404 and 405) connector. The numbers of pins of the connectors 202 and 203 are not limited to four and two.

The IC 200 may be a programmable gate array (PGA) or an application-specific integrated circuit (ASIC). The power control unit 1114 is a PGA, and the image processing unit 1109 is an ASIC. The ICs 200 and 201 are highly integrated, and semiconductor processes of the ICs 200 and 201 are in the order of nanometers. The smaller the semiconductor process is, the lower the antistatic property becomes, so that the probability of an erroneous operation originating from exogenous noise such as static electricity increases.

The connector 202 is fixed to the printed circuit board 100 with locking pins 406 and 407. The connector 203 is fixed to the printed circuit board 100 with locking pins 408 and 409. In a case where the connector 202 is a surface mounted device (SMD) type connector, the locking pins 406 and 407 are soldered to a front layer (signal layer 30 shown in FIG. 5) of the printed circuit board 100. In a case where the connector 202 is a dual in-line package (DIP), the locking pins 406 and 407 pass through the printed circuit board 100 from the front layer (signal layer 30) to a rear layer (signal layer 36 shown in FIG. 5) of the printed circuit board 100 and are also soldered to the printed circuit board 100. The same applies to the connector 203, so that description thereof is omitted.

The front layer (signal layer 30) of the printed circuit board 100 according to the present embodiment includes three ground regions separated by slits. The three ground regions are a signal ground region 101, a frame ground region 102 (a or b), and a static electricity removal ground region 103.

The signal ground region 101 is a region on which the ICs 200 and 201 configured to receive signals from the connectors 202 and 203 are mounted. The signal ground region 101 is connected with the ground via an internal ground layer 32. The potential of the internal ground layer 32 is a reference potential for the signals 300 to 305 and a reference potential for the power to be supplied to the ICs 200 and 201. The signal ground region 101 is situated outside the frame ground region 102*a* and the frame ground region 102*b*.

The connector 202 is mounted on the frame ground region 102*a*, and the frame ground region 102*a* is electrically connected with a metal housing 600. The frame ground region 102*a* is connected with a metallic frame of the connector 202.

On the frame ground region 102*b* is mounted the connector 203, and the frame ground region 102*b* is electrically connected with the metal housing 600. The frame ground region 102*b* is connected with a metallic frame of the connector 203.

In the present embodiment, a static electricity removal ground region 103 is provided in addition to the signal ground region 101 and the frame ground regions 102*a* and 102*b* in the signal layer 30 of the printed circuit board 100. The static electricity removal ground region 103 is in a peripheral portion of the printed circuit board 100. Further, the static electricity removal ground region 103 forms a ground loop without a discontinuity. Further, the static electricity removal ground region 103 respectively surrounds the frame ground region 102*a* without a discontinuity, the frame ground region 102*b* without a discontinuity, and in the present embodiment, the signal ground region 101 without a discontinuity.

Further, the static electricity removal ground region 103 is respectively situated at a position that is outside the frame ground region 102a and at least corresponds to (in other words faces) an insertion opening 202a of the connector 202 into which an external apparatus or a cable is inserted, and situated at a position that is outside the frame ground region 102b and at least corresponds to (in other words faces) an insertion opening 203a of the connector 203 into which a cable is inserted.

The static electricity removal ground region 103 is connected with the ground layer 32. The frame ground regions 102a and 102b and the signal ground region 101 are also connected with the ground layer 32. In other words, the static electricity removal ground region 103 is connected with the frame ground regions 102a and 102b and the signal ground region 101 at the ground layer 32.

The static electricity removal ground region 103 includes through holes through which the screws 20 to 23 are passed. The screws 20 to 23 fix the printed circuit board 100 to the metal housing 600. The through holes may be notches. The screws 20 to 23 are metallic screws and connected with the ground with the printed circuit board 100 fixed to the metal housing 600.

The static electricity removal ground region 103 is completely separated from the frame ground regions 102a and 102b and the signal ground region 101 in the signal layer 30 by a slit 502. The slit 502 is only in the signal layer 30 and does not reach the ground layer 32.

The static electricity removal ground region 103 is situated in the signal layers 30 and 36. The static electricity removal ground region 103 of the signal layer 30 and the static electricity removal ground region 103 of the signal layer 36 are situated in the peripheral portion of the printed circuit board 100. In the present embodiment, the signal layer 36 does not include a frame ground region. Alternatively, the signal layer 36 can include a frame ground region.

In the present embodiment, the signal ground region 101 is situated between the static electricity removal ground region 103 and the frame ground region 102a, and between the static electricity removal ground region 103 and the frame ground region 102b. However, the signal ground region 101 neither has to be situated between the static electricity removal ground region 103 and the frame ground region 102a, nor between the static electricity removal ground region 103 and the frame ground region 102b.

The static electricity removal ground region 103 includes a via hole 107 and is connected with the ground layer 32.

The slit 502 prevents static electricity having entered the peripheral portion of the printed circuit board 100 from being transmitted to the signal ground region 101 and the frame ground regions 102a and 102b. Static electricity having entered the peripheral portion of the printed circuit board 100 is transmitted to the metal housing 600 through the via hole 107 of the static electricity removal ground region 103 and the screws 20 to 23. Static electricity discharged from a person when a device or a cable is attached to or removed from the connector 202 or 203 is prevented from entering the inside of the static electricity removal ground region 103. Static electricity discharged near the connector 202 or 203 is prevented from entering active elements (ICs 200 and 201) that are mounted on the printed circuit board 100 and operate at high frequencies.

The frame ground region 102a is connected with the ground layer 32 and the static electricity removal ground regions 103 of the signal layer 36 via a via hole 106 from the signal layer 30. Static electricity discharged to the frame of the connector 202 is transmitted to the frame ground region 102a via the locking pins 406 and 407. Then, the static electricity is transmitted to the static electricity removal ground region 103 of the signal layer 36 through the via hole 106 and escapes to the metal housing 600.

Further, the frame ground region 102a is separated from the signal ground region 101 by a slit 500. Further, the frame ground region 102b is separated from the signal ground region 101 by a slit 501. Further, in the present embodiment, the static electricity removal ground region 103 and the frame ground region 102a are separated by the slits 502 and 500. Further, the static electricity removal ground region 103 and the frame ground region 102b are separated by the slits 502 and 501. Further, the static electricity removal ground region 103 and the signal ground region 101 are separated by the slit 502. The term "slit" refers to a groove that physically separates a conductor (e.g. copper film) of the signal layer 30 of the printed circuit board 100 so that the signal layer is in an electrically non-conducting state. Specifically, at the signal layer 30, the signal ground region 101 and the frame ground 102a are separated by the slit 500. Further, at the signal layer 30, the signal ground region 101 and the frame ground 102b are separated by the slit 501.

The connector 202 is connected with the ground layer 32 of the printed circuit board 100 via the via hole 106. The via hole 106 according to the present embodiment is a through via hole. Similarly, the connector 203 is connected with the ground layer 32 of the printed circuit board 100 via the via hole 206 (shown in FIG. 4B). A through via hole is a through hole from a front layer to a rear layer. A through via hole is formed by making a hole from a front layer to a rear layer with a drill and coating the hole with a conductor to connect to a plurality of layers. The pins 400 to 403 of the connector 202 are connected with the outside of the frame ground region 102a, i.e., the signal ground region 101, so that the signals 300 to 303 are prevented from being transmitted over two different ground regions. The same applies to the connector 203, so that description thereof is omitted.

Figure 5:
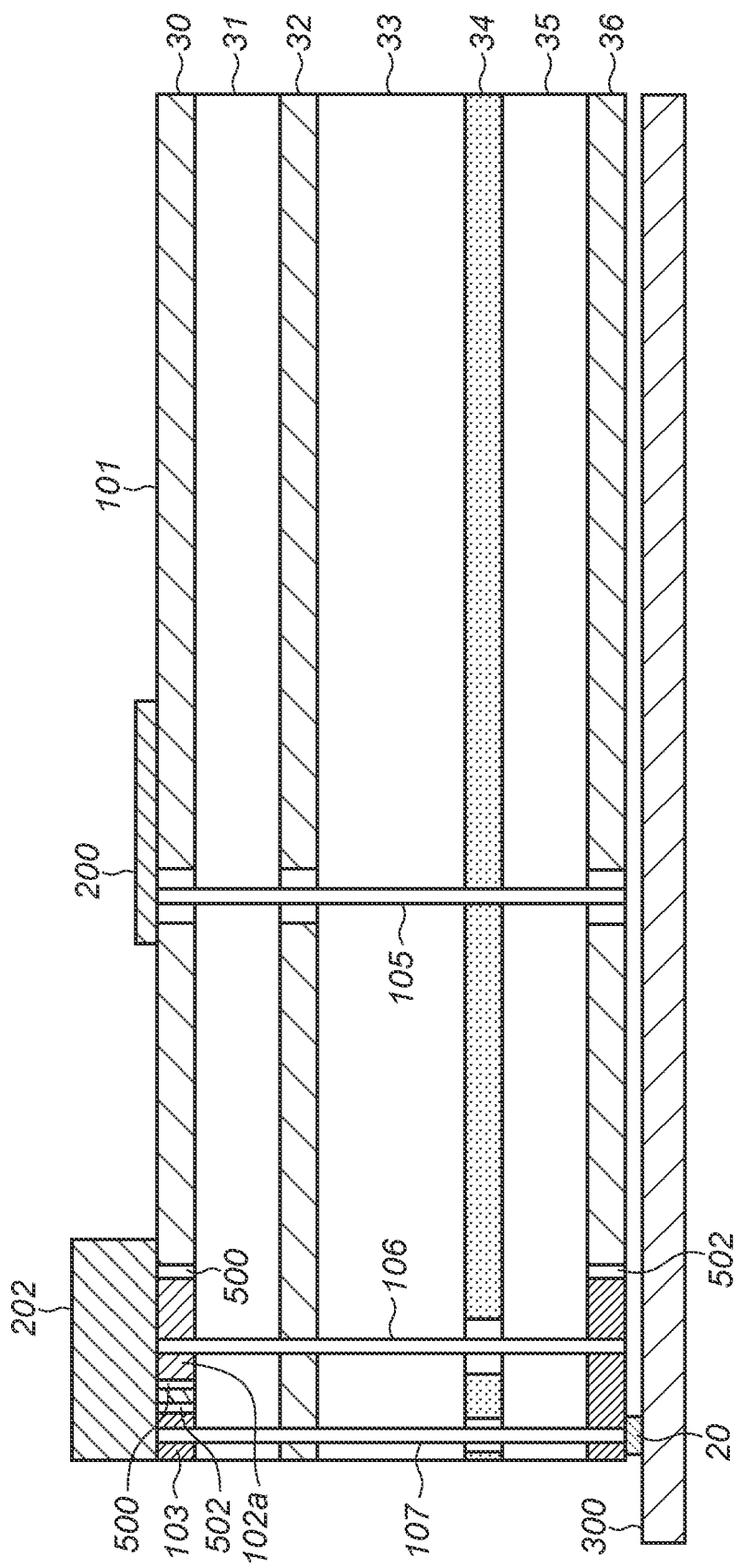
FIG. 5 is a cross-sectional view along A-A' specified in FIG. 3.

FIG. 5 is a cross-sectional view illustrating the printed circuit board 100 along line A-A' specified in FIG. 3. In FIG. 5, each diagonal-line area is a ground region (except for the ICs 200 and 202), and each dotted area is a power layer.

The printed circuit board 100 according to the present embodiment includes four layers. The number of layers of the printed circuit board 100, however, is not limited to four. The printed circuit board 100 may include a different number of layers and for instance six or eight layers.

The signal layers 30 and 36 are provided to transmit signals output from the ICs 200 and 201 to another IC. A signal output from the IC 200 or 201 is transmitted to the signal layer 36 in some cases or is transmitted within the signal layer 30 in some other cases.

The signal layer 30 includes signal lines for the signals 300 to 305. The signal layer 30 includes a power supply plane and the ground regions 101 to 103 in addition to signal lines for the signals 300 to 305. The frame ground region 102a of the signal layer 30 is connected with the ground layer 32 and the signal ground region 101 of the signal layer 36 via the via hole 106.

The ground layer 32 is to stabilize the voltage level of the ground.

A power layer 34 includes a power supply plane of a plurality of systems for use by the ICs 200 and 201 and the connectors 202 and 203. The power supply plane of the power layer 34 supply power to the ICs mounted on the signal layer 30 via a via hole 105. Since the potential of the via hole 105 is the same as the potential of the power supply plane, the via hole 105 is not connected with the ground of the signal layer 30, the ground layer 32, and the ground of the signal layer 36. The via hole 106 is not connected with the power supply plane of the power layer 34.

A material of each layer is a conductor such as copper. Further, prepregs 31 and 35 and a core material 33 are provided between layers. The prepregs 31 and 35 are base materials manufactured by impregnating a glass cloth with a resin such as epoxy and then partially curing the glass cloth. The prepregs 31 and 35 are used to insulate layers when the copper of the layers and the core materials 33 are layered to form the printed circuit board 100.

The screw 20 is fixed to the metal housing 600.

When a cable is inserted into or removed from the connector 202 or 203, static electricity may be discharged from a charged human body, a charged device, or the charged cable and may enter the frame of the connector 202 or 203 that is in contact or the signal lines for the signals 300 to 305 from the connector 202 or 203.

Figure 6:
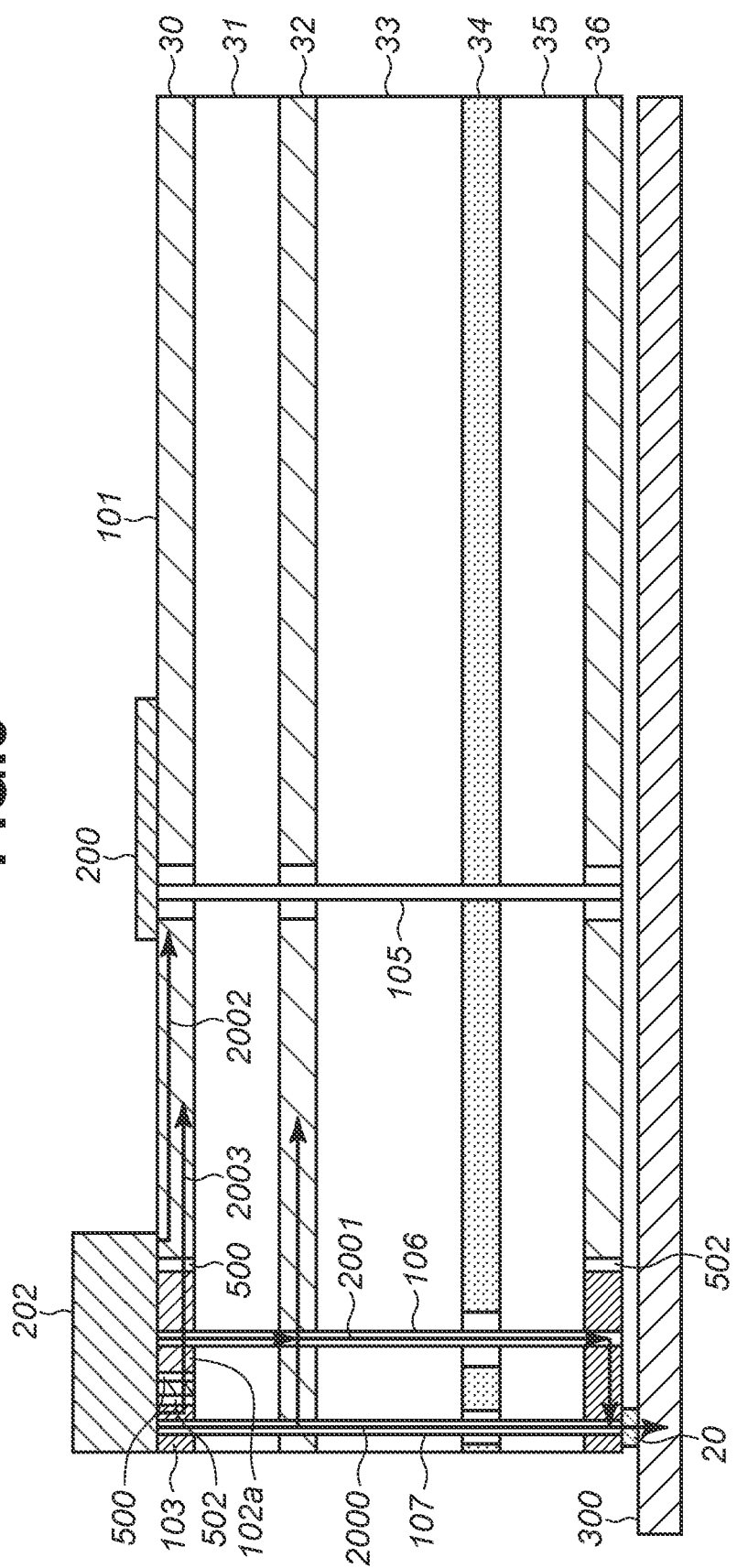
FIG. 6 illustrates a static electricity transmission path.

FIG. 6 illustrates a static electricity transmission path.

When a device or a cable is inserted into or removed from the connector 202 or 203, since the physical distance is small, there is a high possibility that a charged human body or device discharges static electricity to the static electricity removal ground region 103 situated close to the insertion opening 202a (shown in FIG. 4A) of the connector 202. Static electricity discharged to the static electricity removal ground region 103 is transmitted to the ground layer 32 and the signal layer 36 via the via hole 107. Then, the static electricity is transmitted to the metal housing 600 via the screw 20 (path 2000).

Further, static electricity having entered the frame of the connector 202 is transmitted to the frame ground region 102a via the locking pins 406 and 407 and is transmitted to the ground layer 32 and the signal layer 36 via the via hole 106. The via hole 106 is connected with the static electricity removal ground region 103 of the signal layer 36, so that the static electricity escapes to the metal housing 600 through the screw 20 (path 2001).

Noise having entered the signal lines for the signals 300 to 303 connected with the connector 202 may reach the IC 200 (path 2002).

There is a path (path 2003) through which static electricity having entered the static electricity removal ground region 103 and the frame ground region 102a is transmitted to the signal ground region 101 via a parasitic capacitor of the slits 500 and 502. In the present embodiment, the static electricity removal ground region 103 is situated outside the connector 202 and, furthermore, the two slits 500 and 502 are formed up to the signal ground region 101, so that it is difficult for the static electricity to be transmitted to the connector.

As illustrated in FIG. 7, frequencies at which the signal layer 30 and the ground layer 32 of the printed circuit board 100 are likely to vibrate differ because while the signal layer 30 includes the three ground regions 101, 102, 103 separated by the slits 500 and 502, the ground layer 32 does not include such slits, and the shapes of the signal layer 30 and the ground layer 32 are significantly different. Even in a case where static electricity transmitted through the path 2003 causes a resonance phenomenon at the signal ground region 101 of the signal layer 30, a resonance phenomenon of an intensity that is the same as that at the signal layer 30 is less likely to occur at the ground layer 32. Thus, static electricity transmitted to the signal layer 30 is attenuated based on frequency characteristics as the static electricity is transmitted to the ground layer 32 and the signal layer 36. Therefore, the static electricity is less likely to become superimposed noise as the static electricity is transmitted into the internal layer.

According to the present embodiment, the static electricity removal ground region 103 separated from the signal ground region 101 and the frame ground regions 102a and 102b by the slit 502 is situated in the peripheral portion of the printed circuit board 100. Consequently, static electricity is concentrated in the static electricity removal ground region 103 in the peripheral portion of the printed circuit board 100. Thus, static electricity charged on a person, a cable, or a device can escape to the metal housing 600.

Furthermore, since the signal layer 30 of the front layer and the ground layer 32 of the internal layer have different shapes, the resonance frequencies are shifted, so that static electricity transmitted to the internal layer is attenuated. Consequently, antistatic properties of an electronic device such as a printing apparatus that includes the printed circuit board 100 built therein improve, and the possibility of erroneous operations of mounted components such as the IC 200 decreases.

Modified Embodiments

While the example in which the printed circuit board according to the present disclosure is mounted on the image forming apparatus is described in the above-described embodiment, an apparatus on which the printed circuit board according to the present disclosure is to be mounted is not limited to an image forming apparatus. For example, the printed circuit board according to the present disclosure can be mounted on various apparatuses such as notebook personal computers (notebook PCs), tablet PCs, desktop PCs, smartphones, vehicles, air conditioning apparatuses, game machines, and robots.

While the present invention has been described with reference to embodiments, it is to be understood that the invention is not limited to the disclosed embodiments, but is determined by the scope of the following claims.

What is claimed is:

1. A printing apparatus comprising:
a printing unit configured to print an image on a sheet;
a metallic housing to fix a printed circuit board; and
the printed circuit board comprising a first region, a second region and a connector, wherein
on a front layer of the printed circuit board, the connector is mounted in the second region, and the first region and the second region are electrically insulated,
the first region and the second region are connected with a ground of the printed circuit board,
the first region is at a position that is on an extension of an opening direction of an insertion opening of the connector and corresponds to a peripheral portion of the front layer of the printed circuit board,
a hand of a worker approaches the first region when inserting a cable into the connector,
the first region includes a hole or a notch through which a metallic fixing member for fixing the printed circuit board is passed, and
the metallic fixing member is to fix the printed circuit board to the metallic housing.

2. The printing apparatus according to claim 1, wherein the insulation is a space provided between the first region and the second region.

3. The printing apparatus according to claim 1, wherein the ground of the printed circuit board is a solid pattern.

4. The printing apparatus according to claim 1, wherein the first region and the second region are electrically connected by the ground of the printed circuited board and a plurality of via holes.

5. The printing apparatus according to claim 4, wherein the plurality of via holes penetrates all layers that the printed circuit board has.

6. The printing apparatus according to claim 1, wherein the connector is connected with an external apparatus different from the printed circuit board, or a communication cable.

7. The printing apparatus according to claim 1, wherein
the printed circuit board further comprises a third region,
an electronic device that receives a signal from the connector is mounted in the third region, and
on the front layer of the printed circuit board, the first region and the third region are electrically insulated, the second region and the third region are electrically insulated, and the third region is connected with the ground of the printed circuit board.

8. The printing apparatus according to claim 7, wherein the insulation is a space provided between the first region and the third region or a space provided between the second region and the third region.

9. The printing apparatus according to claim 7, wherein the first region is provided so as to surround the third region.

10. The printing apparatus according to claim 7, wherein the first region is provided so as to surround the second region and the third region as one region.

11. The printing apparatus according to claim 1, wherein the first region is provided so as to surround the second region.

12. The printing apparatus according to claim 1, wherein the printed circuit board is a multi-layer printed circuit board including at least a signal layer, a power layer and a ground layer.

13. The printing apparatus according to claim 12, wherein the ground layer is the ground of the printed circuit board.

14. The printing apparatus according to claim 1, wherein a metallic housing of the connector is connected with the second region.

15. The printing apparatus according to claim 14, wherein
a locking pin for fixing the connector to the printed circuit board penetrates all layers that the printed circuit board has, and
the metallic housing of the connector is electrically connected with grounds of a plurality of layers that the printed circuit board has, via the locking pin.

16. The printing apparatus according to claim 15, wherein the locking pin for fixing the connector to the printed circuit board is a metallic locking pin.

17. The printing apparatus according to claim 1, wherein the fixing member is to electrically connect the first region with the housing.

\* \* \* \* \*